US007642827B2

(12) United States Patent
Kwak

(10) Patent No.: US 7,642,827 B2
(45) Date of Patent: Jan. 5, 2010

(54) APPARATUS AND METHOD FOR MULTI-PHASE CLOCK GENERATION

(75) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/128,189

(22) Filed: May 28, 2008

(65) Prior Publication Data

US 2009/0295441 A1    Dec. 3, 2009

(51) Int. Cl.
*H03L 7/06* (2006.01)
(52) U.S. Cl. ...................................... 327/158; 327/156
(58) Field of Classification Search ................. 327/156, 327/158
See application file for complete search history.

(56) References Cited

U.S. PATENT DOCUMENTS

| 6,839,860 | B2 | 1/2005 | Lin |
| 6,950,487 | B2 | 9/2005 | Lin et al. |
| 6,967,514 | B2 | 11/2005 | Kizer et al. |
| 7,227,809 | B2 | 6/2007 | Kwak |
| 7,274,228 | B2 * | 9/2007 | Kim ........................... 327/149 |
| 7,276,949 | B2 | 10/2007 | Johnson |
| 7,548,101 | B2 * | 6/2009 | Shim ........................... 327/175 |
| 2006/0214710 | A1 * | 9/2006 | Gomm et al. ............... 327/158 |
| 2007/0025175 | A1 * | 2/2007 | Liu et al. .................... 365/233 |
| 2007/0025489 | A1 * | 2/2007 | Milton et al. ............... 375/375 |
| 2008/0065922 | A1 * | 3/2008 | Dour et al. .................. 713/400 |
| 2008/0143404 | A1 * | 6/2008 | Shim ........................... 327/158 |
| 2009/0100285 | A1 * | 4/2009 | Bae et al. .................... 713/400 |
| 2009/0122936 | A1 * | 5/2009 | Milton et al. ............... 375/360 |

* cited by examiner

*Primary Examiner*—Lincoln Donovan
*Assistant Examiner*—Adam D Houston
(74) *Attorney, Agent, or Firm*—Knobbe, Martens, Olson & Bear LLP

(57) ABSTRACT

An apparatus and method for multi-phase clock generation are disclosed. One embodiment of the apparatus includes a module generating first and second intermediate signals delayed from first edges of a clock signal having a first frequency. Each of the first and second intermediate signals has a second frequency that is half of the first frequency. The first and second intermediate signals have a phase difference of 180° from each other. The apparatus also includes a first delay line delaying the first intermediate signal by a first delay amount; a second delay line delaying the first intermediate signal by a second delay amount; a third delay line delaying the second intermediate signal by a third delay amount; and a fourth delay line delaying the second intermediate signal by a fourth delay amount. The apparatus also includes a closed feedback loop for detecting and adjusting the second and fourth delay amount.

26 Claims, 7 Drawing Sheets

APPARATUS AND METHOD FOR MULTI-PHASE CLOCK GENERATION

CROSS-REFERENCE TO RELATED APPLICATIONS

This application is related to APPARATUS AND METHOD FOR MULTI-PHASE CLOCK GENERATION (Inventor: Jongtae Kwak; Ser. No. 12/128,367, filed on even date herewith), the disclosure of which is incorporated by reference in its entirety.

BACKGROUND OF THE INVENTION

1. Field of the Invention

Embodiments of the invention relate to electronic devices, and more particularly, to multi-phase clock generation for electronic devices.

2. Description of the Related Art

Certain electronic devices, such as DRAM, use clock signals for timing data transmission over communication channels. A clock signal typically has rising edges and falling edges. A rising edge is the transition of the clock signal from a low level to a high level. A falling edge is the transition of the clock signal from a high level to a low level.

Recently, the data processing speed of processors, such as a central processing unit (CPU), has been significantly improved. In order to match the improved data processing speed, high-speed data transmission schemes have been developed. For example, double data rate (DDR) schemes have been used with certain memory devices for data transmission. Examples of DDR schemes include DDR, DDR2, and DDR3. Memory devices using a DDR scheme transfer data on both the rising and falling edges of an external clock signal.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

Figure 1:
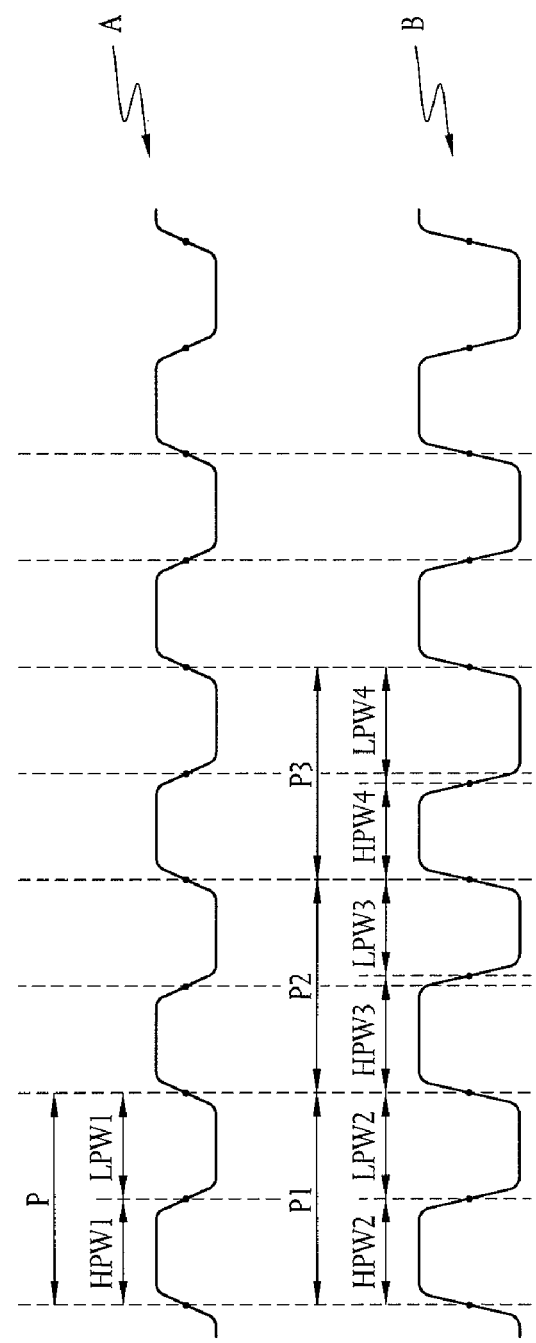
FIG. 1A is a timing diagram of an ideal clock signal for data synchronization.
FIG. 1B is a timing diagram of a clock signal having duty cycle errors.

Referring to FIG. 1A, a typical clock signal periodically alternates between a high level and a low level. Ideally, the duration of the clock signal at the high level (hereinafter, referred to as a "high pulse width") is the same as the duration of the clock signal at the low level (hereinafter, referred to as a "low pulse width") during a single period. In FIG. 1A, which illustrates an ideal clock signal A, the high pulse width HPW1 of the clock signal A is the same as the low pulse width LPW1 of the clock signal A during a given period P.

In practice, however, the high pulse width of a clock signal may not always be the same as the low pulse width of the clock signal during a single period, as shown in FIG. 1B. For example, during a first period P1, the high pulse width HPW2 of a clock signal B is substantially the same as the low pulse width LPW2 of the clock signal B. During a second period P2, however, the high pulse width HPW3 of the clock signal B is longer than the low pulse width LPW3 of the clock signal B. During a third period P3, the high pulse width HPW4 of the clock signal B is shorter than the low pulse width LPW4 of the clock signal B. Such irregularities in the high pulse width can be referred to as duty cycle errors. The duty cycle errors of a clock signal generate jitter in the falling edges of the clock signal.

Jitter in the falling edges of a clock signal generates inaccurate timing information for data transmission that is at least partly synchronized with the falling edges. As described above, certain data transmission schemes, such as double data rate schemes, use both the rising and falling edges of a clock signal for timing the data transmission. In such schemes, jitter in the falling edges of a clock signal can produce data transmission errors.

As the clock frequency is increased, such jitter more adversely affects the accuracy of the data transmission. As the clock frequency is increased, the period of the clock signal is reduced, and the high pulse width is also reduced. Thus, the same amount of reduction or increase in the high pulse width affects a higher frequency clock signal more significantly than a lower frequency clock signal. In other words, duty cycle errors more adversely affect a higher frequency clock signal than a lower frequency clock signal in providing accurate falling edge timing.

In addition, in certain electronic devices, high frequency clock signals (for example, clock signals having a frequency higher than about 1 GHz) may fail due to their fast level transitions. In such instances, the electronic device cannot continue data transmission.

Thus, there is a need for a robust clocking scheme for data transmission of electronic devices that are at least partly synchronized with the falling edges of a clock signal. Particularly, there is a need to provide accurate failing edge information that is immune to possible duty cycle errors.

In one embodiment, a clock synchronization circuit in an electronic device receives an external clock signal. The clock synchronization circuit generates reference signals in reference only to the rising edges of the external clock signal, such that the reference signals do not carry possible duty cycle errors in the external clock signal. The reference signals have a phase difference of 180° from each other, that is, have opposite phase to each other. In addition, the reference signals have a frequency that is a half of the frequency of the external clock signal. This reduces a possible clock failure due to excessively fast signal level transitions while also reducing power consumption.

The reference signals are used to generate four phase clock signals having a phase difference of 90° from one another. The four phase clock signals correspond to the rising and falling edges of the external clock signal for two periods. Because the four phase clock signals are generated with the reference signals having no duty cycle errors, they are immune to possible duty cycle errors in the external clock signal. Therefore, the clock synchronization circuit can provide accurate falling edge information of the external clock signal.

In the embodiments described below, phase differences are expressed in angle with reference to one period of the reference signals unless otherwise specified. For example, a phase difference of 90° refers to a difference of one fourths (¼) of one period (2tCK in FIG. 5B) of the reference signals.

Figure 2:
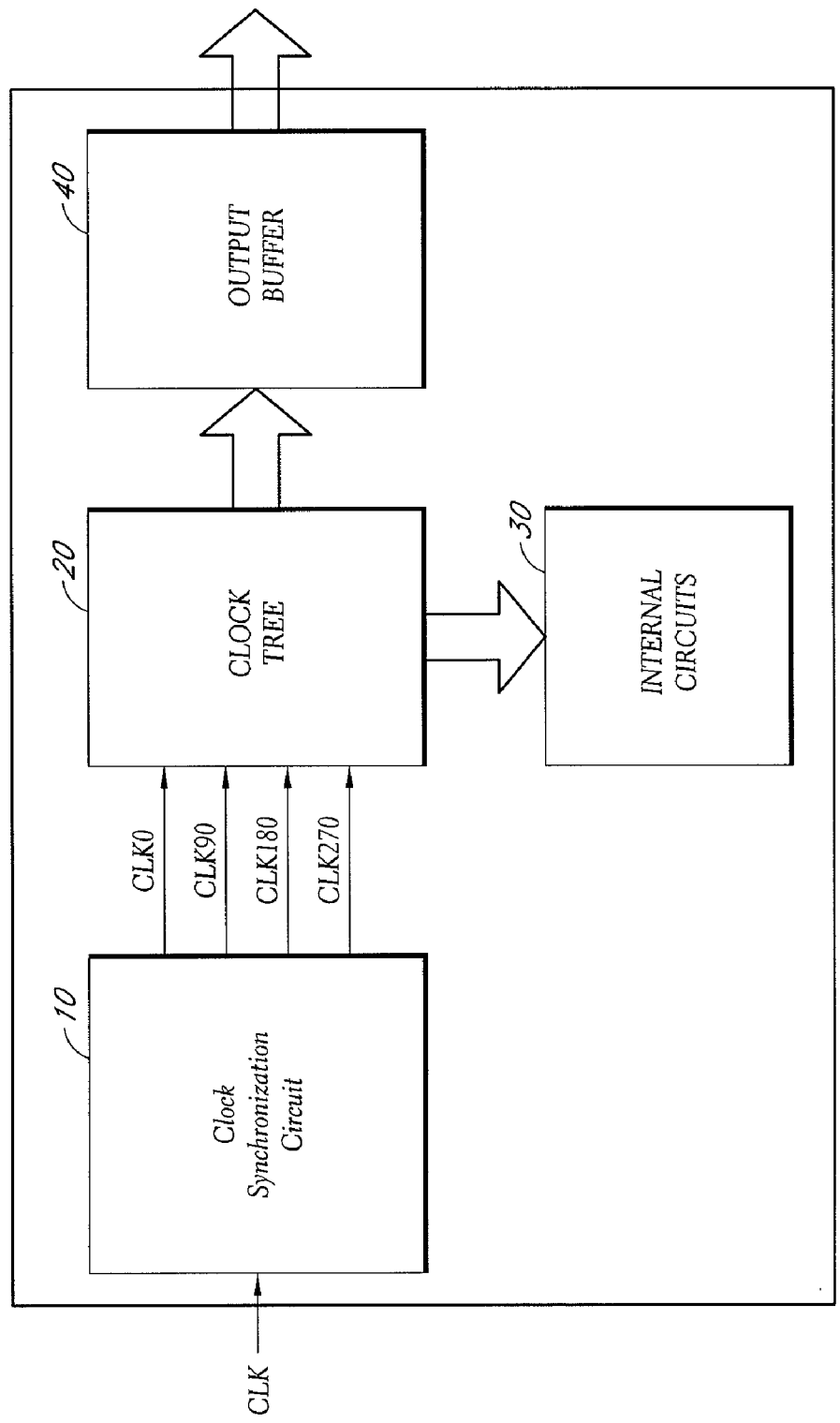
FIG. 2 is a schematic block diagram of an electronic device employing a clock synchronization circuit according to one embodiment.

Referring to FIG. 2, an electronic device that is synchronized with clock signals generated by a multi-phase clock generation scheme according to one embodiment will be now described. The illustrated device is a memory device 100 such as a DRAM. In other embodiments, any other electronic devices or systems can use the multi-phase clock generation scheme.

The memory device 100 includes a clock synchronization circuit 10, a clock tree 20, internal circuits 30, and an output buffer 40. The memory device 11 receives an external clock signal CLK from an external device (not shown), and outputs data in synchronization with the external clock signal CLK. In the illustrated embodiment, the memory device 100 uses a double data rate (DDR) scheme. In other embodiments, the memory device may use DDR2 or DDR3 scheme or a further advanced DDR scheme.

The clock synchronization circuit 10 receives the external clock signal CLK and generates first to fourth phase clock signal CLK0, CLK90, CLK180, CLK270. Details of the clock synchronization circuit 10 will be described below in connection with FIGS. 3-6.

The clock tree 20 receives the first to fourth phase clock signal CLK0, CLK90, CLK180, CLK270 from the clock synchronization circuit 10. The clock tree 20 serves to distribute the phase clock signals for timing the internal circuits 30. The clock tree 20 also transfers output signals (for example, data signals) from the internal circuits 30 to the output buffer 40.

The internal circuits 30 may include various circuits, depending on the electronic device. In the illustrated embodiment where the device is a memory device 1, the internal circuits 30 may include, but are not limited to, a memory array, a column decoder circuit, a row decoder circuit, an address register, and a control logic circuit.

The output buffer 40 receives the output signals from the clock tree 20. The output buffer 40 provides data DATA through ports (not shown) to communication channels.

Figure 3:
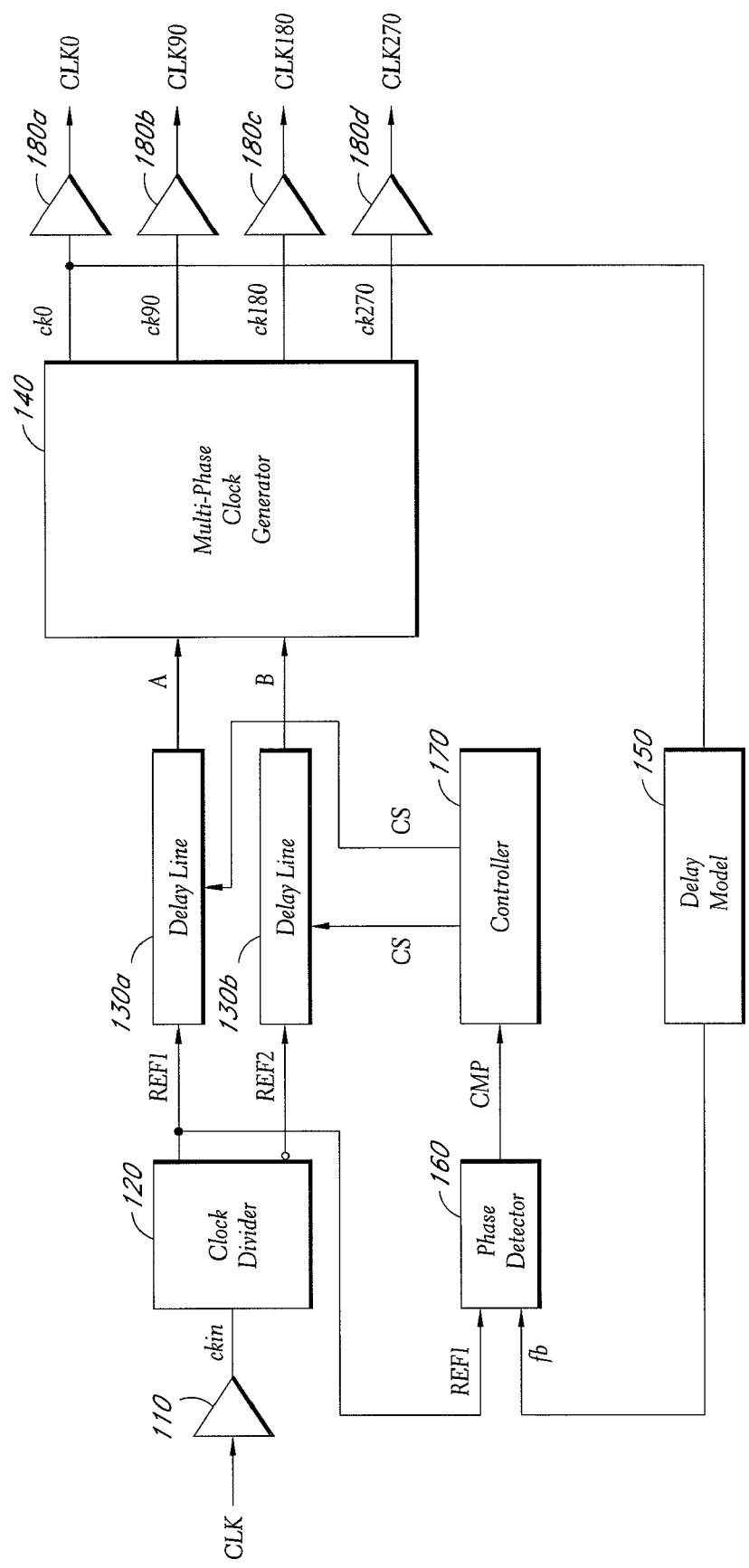
FIG. 3 is a schematic block diagram of one embodiment of the clock synchronization circuit of FIG. 2, including a multi-phase clock generator.

Referring to FIG. 3, one embodiment of the clock synchronization circuit of FIG. 2 will be now described. The illustrated circuit 10 includes an input buffer 110, a clock divider 120, first and second delay elements, such as delay lines 130a, 130b, a multi-phase clock generator 140, a delay model 150, a phase detector 160, a controller 170, and first to fourth clock buffers 180a-180d. Other examples of delay elements include, but are not limited to, delay stages, delay circuits, and delay cells.

The first delay line 130a, the multi-phase clock generator 140, the delay model 150, and the phase detector 160, and the controller 170 together form a delay-locked loop (DLL) for synchronizing the output of the memory device 100 of FIG. 2 with the external clock signal CLK. The input buffer 110, the clock divider 120, the first delay line 130a, the multi-phase clock generator 140, and the first clock buffer 180a form at least part of a forward clock path. The term "forward clock path delay" refers to a clock delay occurring while a clock signal travels along the forward clock path.

The input buffer 110 receives an external clock signal CLK. The input buffer 110 generates a clock-in signal ckin. In one embodiment, the clock-in signal ckin has the same frequency as the external clock signal CLK, but has a higher amplitude, for example, providing a full-swing between the voltages of an internal voltage source Vcc and ground GND. The clock-in signal ckin carries through the duty cycle error, if any, in the external clock signal CLK.

The clock divider 120 receives the clock-in signal ckin, and generates a first reference signal REF1 that has a frequency that is half of the frequency of the clock-in signal. In other words, the period of the first reference signal REF1 is twice as long as that of the clock-in signal ckin. When generating the first reference signal REF1, the clock divider 120 changes the signal level only at the rising edges of the clock-in signal ckin. For example, at one point in time, the clock divider 120 changes the first reference signal REF1 from a low level to a high level when the clock-in signal ckin transitions from a low level to a high level (a rising edge). When the clock-in signal ckin transitions from the high level to the low level (a falling edge), the first reference signal REF1 stays at the high level. When the clock-in signal transitions again from the low level to the high level (another rising edge), the first reference signal transitions from the high level to the low level. In this manner, the frequency of the clock-in signal ckin is reduced by half by the clock divider 120.

Because the clock divider 120 triggers the transitions of the first reference signal REF1 only at the rising edges of the clock-in signal ckin, it does not transfer a duty cycle error from the clock-in signal ckin into the first reference signal REF1. Thus, the first reference signal REF1 does not retain a duty cycle error that may exist in the clock-in signal ckin.

The clock divider 120 may also include a phase splitter that generates a second reference signal REF2. The second reference signal has a phase difference of 180° from the first reference signal REF1. The second reference signal REF2 is an inverted form of the first reference signal REF1 that transitions only at the rising edges of the clock-in signal ckin. Thus, similar to the first reference signal REF1, the second reference signal REF2 does not retain a duty cycle error that may exist in the clock-in signal ckin.

The first delay line 130a receives the first reference signal REF1 from the clock divider 120. The first delay line 130a delays the first reference signal REF1, thereby outputting a first intermediate signal A. The first delay line 130a includes a plurality of delay stages which can be added to or eliminated from the forward clock path, to change the propagation delay through the delay line 130a. In one embodiment, the delay line 130a can include a plurality of logic gates (for example, inverters) and a shift register. In another embodiment, the delay line 130a can include a plurality of logic gates and a counter. A skilled artisan will appreciate that various configurations of delay stages, delay cells, or delay circuits can be adapted for the first delay element, such as delay line 130a.

The second delay line 130b receives the second reference signal REF2 from the clock divider 120. The second delay line 130b delays the second reference signal REF2, thereby outputting a second intermediate signal B. The second delay line 130b may have the same configuration as the first delay line 130a. A skilled artisan will appreciate that various configurations of delay stages, delay cells, or delay circuits can be adapted for the second delay element, such as delay line 130b. In the context of this document, the clock divider 120 and the delay lines 130a, 130b may be collectively referred to as an intermediate signal generation module.

The multi-phase clock generator 140 receives the first and second intermediate signals A, B. The multi-phase clock generator 140 generates first to fourth intermediate phase clock signals ck0, ck90, ckl80, ck270.

The delay model 150 receives the first intermediate phase clock signal ck0 from the multi-phase clock generator 140, and further delays it, thereby outputting a feedback signal fb to the phase detector 160. The delay model 150 emulates delays along the forward clock path of the memory device 100 of FIG. 2 except for a delay associated with the first delay line 130a. In the illustrated embodiment, the delay model 150 may form a replica of the forward clock path delay associated with the input buffer 110, the clock divider 120, the first clock buffer 180a, the clock tree 20 (FIG. 2), and the output buffer 40 (FIG. 2).

The phase detector 160 compares the first reference signal REF1 with the feedback signal fb from the delay model 150. The phase detector 160 generates a comparison signal CMP corresponding to a phase difference between the first reference signal REF1 and the feedback signal fb. The phase detector 160 provides the comparison signal CMP to the controller 170.

The controller 170 receives the comparison signal CMP, and controls the shift registers of the first and second delay lines 130a, 130b in response to the comparison signal CMP. The shift registers are configured to select the delay amounts of the delay lines 130a, 130b.

The first to fourth clock buffers 180a-180d receive the first to fourth intermediate phase clock signals ck0, ck90, ckl80, ck360, respectively, and outputs first to fourth phase clock signals CLK0, CLK90, CLK180, CLK270, respectively. The first to fourth clock buffers 180a-180d latch the first to fourth intermediate phase clock signals ck0, ck90, ck180, ck270 while further delaying the intermediate phase clock signals. The first to fourth phase clock signals CLK0, CLK90, CLK180, CLK270 are provided to the internal circuits 30 via the clock tree 20.

Figure 4:
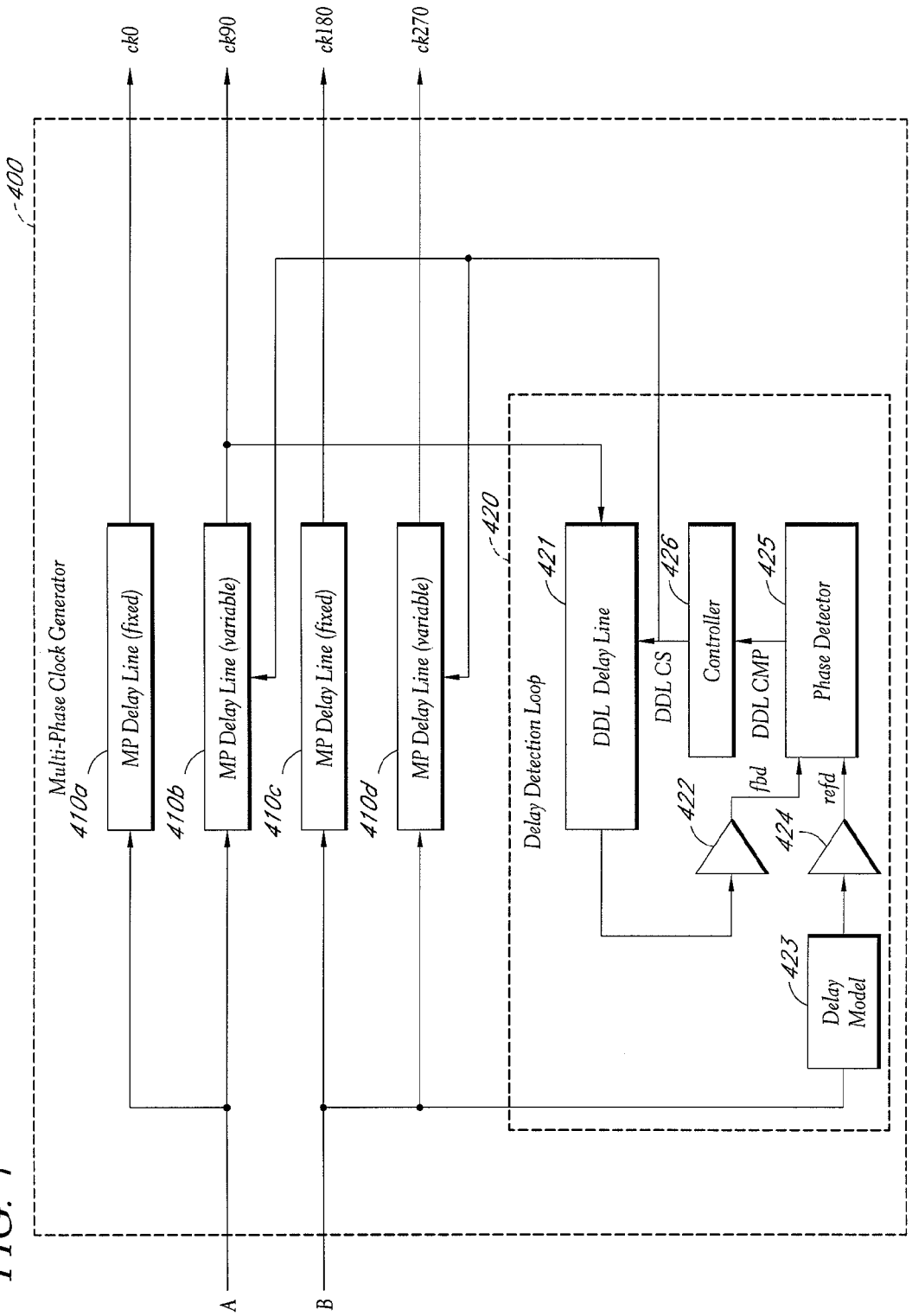
FIG. 4 is a schematic block diagram of one embodiment of the multi-phase clock generator of FIG. 3.

Referring to FIG. 4, one embodiment of the multi-phase clock generator of FIG. 3 will be now described in detail. The multi-phase clock generator 400 includes first to fourth multi-phase (MP) delay lines 410a-410d and a delay detection loop (DDL) 420.

The first to fourth MP delay lines 410a-410d receive the first and second intermediate signals A, B and generate first to fourth intermediate phase clock signals ck0, ck90, ck180, ck270. Each of the first and third MP delay lines 410a, 410c provides a fixed delay to a signal passing therethrough. Each of the second and fourth MP delay lines 410b, 410d provides a variable delay ranging from about 0° to about 180° to a signal (that is, the first or second intermediate signals A, B) passing therethrough. In another embodiment, the upper limit of the variable delay can be about 90° plus the minimum delay of the second or fourth MP delay lines 410b, 410d. In other embodiments, the upper limit of the variable delay can be any suitable amount between about 90° plus the minimum delay and about 180°. A skilled artisan will appreciate that various configurations of delay stages, delay cells, or delay circuits can be adapted for the first to fourth MP delay elements, such as delay lines 410a-410d.

In one embodiment, each of the second and fourth MP delay lines 410b, 410d includes a plurality of logic gates (for example, inverters) connected in series. In such an embodiment, each of the second and fourth MP delay lines 410b, 410d has a minimum delay greater than 0°. The minimum delay can be a delay associated with one or two inverters in the delay lines 410b, 410d.

The fixed delays of the first and third MP delay lines 410a, 410c may be substantially equal to the minimum delays of the second and fourth MP delay lines 410b, 410d, respectively. In such an embodiment, each of the first and third MP delay lines 410a, 410c may include a number of inverters that can generate substantially the same delay as the minimum delay of the second or fourth MP delay line 410b, 410d, without having the same full chain of inverters as the second and fourth MP delay line 410b, 410d.

The minimum delays of the second and fourth MP delay lines 410b, 410d may be substantially the same as each other. Because the minimum delays of the second and fourth MP delay lines 410b, 410d may be substantially equal to the fixed delays of the first and third MP delay lines 410a, 410c, respectively, the fixed delays of the first and third MP delay lines 410a, 410c may also be substantially the same as each other. In one embodiment, each of the minimum delay of the second MP delay line 410b and the fixed delay of the first MP delay line 410a may correspond to a phase difference of about 5° with reference to the first intermediate signal A. Each of the minimum delay of the fourth MP delay line 410d and the fixed delay of the third MP delay lines 410c may correspond to a phase difference of about 5° with reference to the second intermediate signal B.

In the illustrated embodiment, each of the second and fourth MP delay lines 410b, 410d may also include a shift register configured to select a delay amount of the MP delay line 410b, 410d. A skilled artisan will appreciate that each of the second and fourth MP delay lines 410b, 410d may include additional circuitry to provide a variable delay.

The delay detection loop (DDL) 420 serves to detect a phase difference between the second intermediate phase clock signal ck90 and the second intermediate signal B, and adjust the delay amounts of the second and fourth MP delay lines 410b, 410d. The DDL 420 may include a DDL delay line 421, a first DDL buffer 422, a DDL delay model 423, a second DDL buffer 424, a DDL phase detector 425, and a DDL controller 426. The second MP delay line 410b, the DDL delay line 421, and the first DDL buffer 422 form a first DDL path. The DDL delay model 423 and the second DDL buffer 424 form a second DDL path.

The DDL delay line 421 receives the second intermediate phase clock signal ck90 from the second MP delay line 410b, and delays the second intermediate phase clock signal ck90, thereby providing an output signal to the first DDL buffer 422. In the illustrated embodiment, the DDL delay line 421 may include a series of delay cells (which includes, for example, logic gates), a shift register, and additional circuitry to provide a variable delay ranging from about 0° to about 180°. In another embodiment, the upper limit of the variable delay can be about 90° plus an intrinsic delay of the DDL delay line 421. In other embodiments, the upper limit of the variable delay can be any suitable amount between about 90° plus the intrinsic delay and about 180°. The delay cells may be connected to the shift register via tap lines.

The first DDL buffer 422 receives the output signal from the DDL delay line 421, and provides a detection feedback signal fbd to the DDL phase detector 425. The first DDL buffer 422 further delays the output signal from the DDL delay line 421.

The DDL delay model 423 receives the second intermediate signal B from the second delay line 130b (FIG. 3) and further delays the second intermediate signal B. The DDL delay model 423 emulates an intrinsic delay tID associated with the DDL delay line 421 and the minimum delay of the second MP delay line 410b. The DDL delay model 423 provides a delayed second intermediate signal to the second DDL buffer 424.

The second DDL buffer 424 receives the delayed second intermediate signal from the DDL delay model 423, and provides a detection reference signal refd to the DDL phase detector 425. The second DDL buffer 424 further delays the delayed second intermediate signal by substantially the same amount of delay as the delay associated with the first DDL buffer 422.

The DDL phase detector 425 compares the detection feedback signal fbd with the detection reference signal refd. The DDL phase detector 425 generates a DDL comparison signal DDLCMP in response to a phase difference between the detection feedback signal fbd and the detection reference signal refd. The DDL phase detector 425 provides the comparison signal DDLCMP to the DDL controller 426.

The DDL controller 426 receives the comparison signal DDLCMP, and provides the DDL delay line 421 with a DDL control signal DDLCS to adjust an amount of delay generated by the DDL delay line 421. The DDL controller 426 also provides the second and fourth MP delay lines 410*b*, 410*d* with the DDL control signal DDLCS to adjust an amount of delay generated by each of the second and fourth MP delay lines 410*b*, 410*d*.

With reference to FIGS. 3, 4, and 5A-5D, the operation of the clock synchronization circuit 10 will now be described. The input buffer 110 receives the external clock signal CLK (FIG. 5A) which has a clock period tCK. The clock period tCK is defined as a period between two immediately subsequent rising edges of the clock signal CLK. The clock period tCK is substantially constant throughout the external clock signal CLK.

Figure 5A:
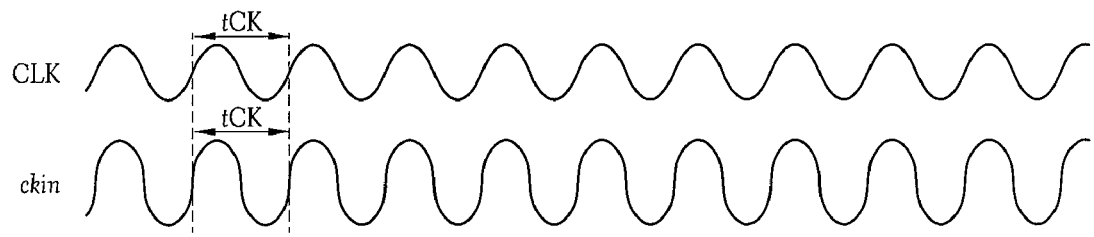
FIGS. 5A-5D are timing diagrams illustrating the operation of the clock synchronization circuit of FIG. 3.

The input buffer 110 provides the clock divider 120 with the clock-in signal ckin (FIG. 5A). In one embodiment, the clock-in signal ckin has a delay from the external clock signal CLK while having a higher amplitude, providing a full swing between the voltages of an internal voltage source Vcc and ground GND. The delay is an inherent delay associated with the input buffer 110. The clock-in signal ckin, however, has the same frequency as the external clock signal CLK. Thus, the clock-in signal ckin also has the same clock period tCK as that of the external clock signal CLK. In addition, when the external clock signal CLK has a duty cycle error, the clock-in signal ckin also has the same duty cycle error.

Figure 5B:
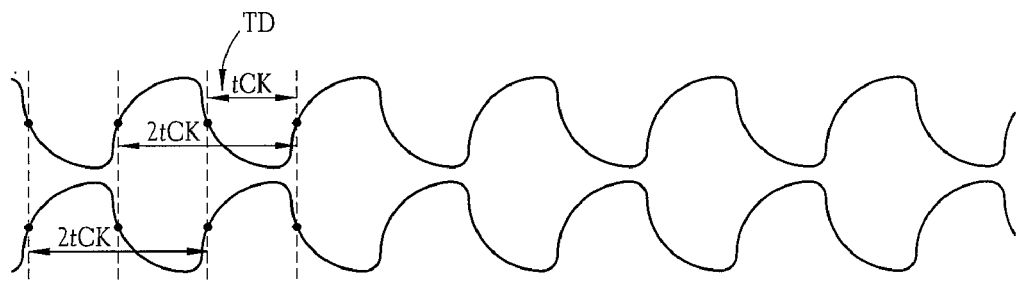
Figure 5C:
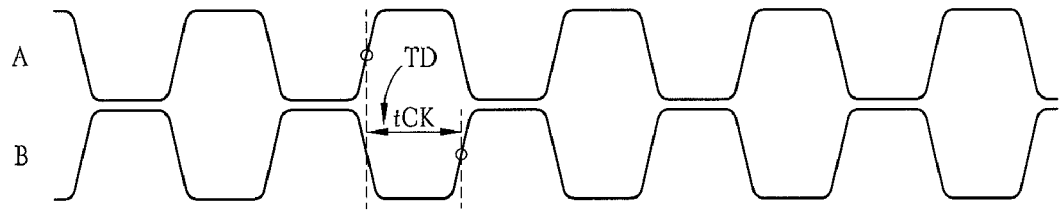

The clock divider 120 receives the clock-in signal ckin and generates the first and second reference signals REF1, REF2 (FIG. 5B). The first and second reference signals REF1, REF2 have a frequency that is half of the frequency of clock-in signal ckin. Thus, each of the first and second reference signals REF1, REF2 has a period 2tCK that is twice as long as the clock period tCK of the clock-in signal ckin. The second reference signal REF2 is an inverted form of the first reference signal REF1, and has a phase difference of 180° from the first reference signal REF1. Thus, a time difference TD between a rising edge of the first reference signal REF1 and an immediately following rising edge of the second reference signal REF2 is tCK.

When generating the first and second reference signals REF1, REF2, the clock divider 120 changes the signal level only at the rising edges of the clock-in signal ckin, but not at the falling edges of the clock-in signal ckin. Thus, the first and second reference signals REF1, REF2 do not carry a duty cycle error, if any, of the clock-in signal ckin. More details of generating the first and second reference signals REF1, REF2 have been described above in connection with FIG. 3.

The first and second delay lines 130*a*, 130*b* delay the first and second reference signals REF1, REF2 by substantially the same amount, and output the first and second intermediate signals A, B (FIG. 5C), respectively. Because the first and second delay lines 130*a*, 130*b* provide substantially the same amount of delay, the resulting intermediate signals A, B maintain the time difference TD between adjacent rising edges of the first and second reference signals REF1, REF2. The time difference TD is tCK (the clock period of the external clock signal).

The first intermediate signal A is supplied to the first and second MP delay lines 410*a*, 410*b* (FIG. 4). The first MP delay line 410*a* delays the first intermediate signal A by a fixed amount of delay as described earlier in connection with FIG. 4. At the start of the operation of the clock synchronization circuit 10, the second MP delay line 410*b* is set to provide its minimum delay as described earlier in connection with FIG. 4. In this manner, at the start of the operation, the first and second MP delay lines 410*a*, 410*b* output the first and second intermediate phase clock signals ck0, ck90, respectively, that are delayed from the first intermediate signal A by substantially the same amount.

Similarly, the second intermediate signal B is supplied to the third and fourth MP delay lines 410*c*, 410*d* (FIG. 4). The third MP delay line 410*c* delays the second intermediate signal B by a fixed amount of delay as described above in connection with FIG. 4. At the start of the operation of the clock synchronization circuit 10, the fourth MP delay line 410*d* is set to provide its minimum delay which has been described above in connection with FIG. 4. In this manner, at the start of the operation, the third and fourth MP delay lines 410*c*, 410*d* output the third and fourth intermediate phase clock signals ckl80, ck270, respectively, that are delayed from the second intermediate signal B by substantially the same amount.

The delay model 150 receives the first intermediate phase clock signal ck0 and further delays the signal ck0 by a delay amount associated with the forward clock path described earlier in connection with FIG. 3. The delay model 150 provides the delayed first intermediate phase clock signal ck0 as the feedback signal fb to the phase detector 160.

The phase detector 160 compares the feedback signal fb with the first reference signal REF1, and detects a phase difference between the signals fb and REF1. The phase detector 160 provides the controller 170 with the comparison signal CMP indicative of the phase difference.

The controller 170 receives the comparison signal CMP and provides the control signals CS to the first and second delay lines 130*a*, 130*b* in response to the comparison signal CMP. The control signals CS are the same as each other, and thus, the first and second delay lines 130*a*, 130*b* are adjusted to provide the same amount of delay to the first and second reference signals REF1, REF2. This process is repeated until the phase detector 160 detects no phase difference between the first reference signal REF1 and the feedback signal fb.

Referring again to FIG. 4, the operation of the delay detection loop 420 will be described below in detail. The DDL delay line 421 receives the second intermediate phase clock signal ck90 from the second MP delay line 410*b*. At the start of the operation of the clock synchronization circuit 10, the DDL delay line 421 is set to provide the second intermediate phase clock signal ck90 with a minimum delay that is substantially equal to the intrinsic delay tID of the DDL delay line 421. The DDL delay line 421 provides its output signal to the first DDL buffer 422. The first DDL buffer 422 further delays the output signal, thereby providing the detection feedback signal fbd to the DDL phase detector 425.

The DDL delay model 423 receives the second intermediate signal B, and delays the second intermediate signal B by a total amount of the intrinsic delay tID of the DDL delay line 421 and the minimum delay of the second MP delay line 410*b*. The DDL delay model 423 provides the delayed signal as the detection reference signal refd to the DDL phase detector 425. The DDL phase detector 425 detects a phase difference between the detection reference signal refd and the detection feedback signal fbd.

At the start of the operation, an amount of delay by the first DDL path (the second MP delay line 410*b*, the DDL delay line 421, and the first DDL buffer 422) is substantially the same as an amount of delay by the second DDL path (the DDL delay model 423 and the second DDL buffer 424). Thus, the first intermediate signal A and the second intermediate signal B are delayed by substantially the same amount while travelling along the first and second DDL paths, respectively. Thus, at the start of the operation, an initial phase difference of about 180° between the first and second intermediate signals A, B is carried to the DDL phase detector 425.

The DDL phase detector 425, upon detecting the phase difference, provides the DDL controller 426 with a DDL comparison signal DDLCMP indicating that there is a phase difference. The DDL controller 426 provides a DDL control signal DDLCS to the DDL delay line 421, and the second and fourth MP delay lines 410*b*, 410*d*, such that the amounts of delay produced by the delay lines 421, 410*b*, 410*d* are increased.

The delay amounts of the delay lines 421, 410*b*, 410*d* are increased by repeating the process described above until the DDL phase detector 425 detects no phase difference. When the DDL phase detector 425 detects no phase difference, the DDL 420 is locked-in, and the DDL 420 no longer increases the delay amounts of the delay lines 421, 410*b*, 410*d*.

While the process described above is performed, the DDL controller 426 provides the second and fourth MP delay lines 410*b*, 410*d* with the same DDL control signal DDLCS. Thus, the delay amount of each of the second and fourth MP delay lines 410*b*, 410*d* is also increased until the DDL 420 is locked.

The DDL delay line 421 and the second MP delay line 410*b*, when locked, reduce the initial phase difference (about 180°) to about 0°. The DDL delay line 421 and the second MP delay line 410*b* delay the second intermediate signal B by substantially the same amount as each other because they are controlled by the same DDL controller 426. Thus, when the DDL delay line 421 provides a delay of 90°, the second MP delay line 410*b* also provides a delay of 90°, such that there is substantially no phase difference between the MP feedback signal fbd and the MP reference signal refd. In other words, the DDL delay line 421 generates a delay of about 90° when locked-in. Thus, each of the second and fourth MP delay lines 410*b*, 410*d* generates a delay of about 90° when the DDL 420 is locked-in.

When the DDL 420 is locked-in, the first MP delay line 410*a* delays the first intermediate signal A by its fixed delay amount. The second MP delay line 410*b* delays the first intermediate signal A by a total of its minimum delay and about 90°. Thus, the first and second intermediate phase clock signals ck0, ck90 have a phase difference of about 90° and a time difference of about tCK/2 between their immediately subsequent rising edges.

Similarly, the third MP delay line 410*c* delays the second intermediate signal B by its fixed delay amount. The fourth MP delay line 410*d* delays the fourth intermediate signal B by a total of its minimum delay and about 90°. Thus, the third and fourth intermediate phase clock signals ck180, ck270 have a phase difference of about 90° and a time difference of about tCK/2 between their immediately subsequent rising edges. Because there is a phase difference of about 180° between the first and second intermediate signals A, B, the third intermediate phase clock signal ck180 has a phase difference of about 180° from the first intermediate phase clock signal ck0. The fourth intermediate phase clock signal ck270 has a phase difference of about 270° with the first intermediate phase clock signal ck0.

Figure 5D:
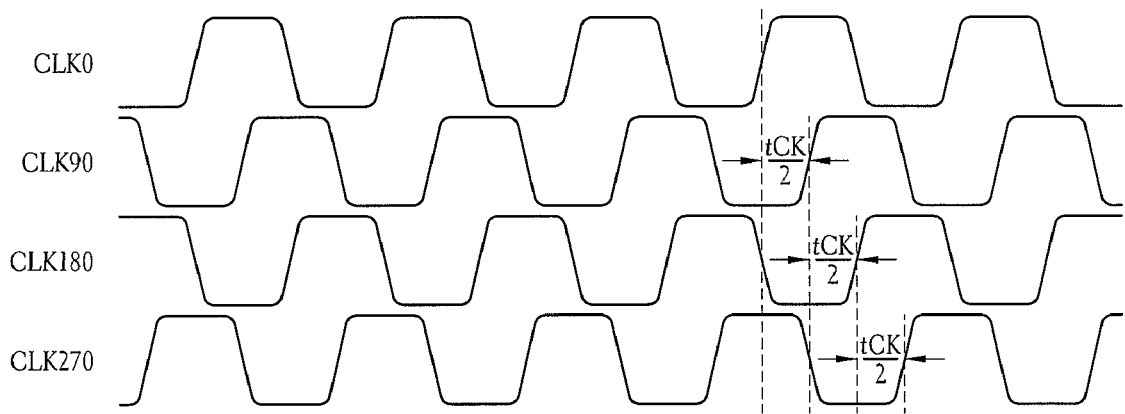

The first to fourth intermediate phase clock signals ck0, ck90, ck180, ck270 are further delayed by the same delay amount by the first to fourth clock buffers 180*a*-180*d*. Thus, a phase difference between any two of the first to fourth intermediate phase clock signals ck0, ck90, ck180, ck270 is preserved in the first to fourth phase clock signals CLK0, CLK90, CLK180, CLK270. Thus, as shown in FIG. 5D, the first and second phase clock signals CLK0, CLK90 have a time difference of about tCK/2 between their immediately subsequent rising edges. The second and third phase clock signals CLK90, CLK180 have a time difference of about tCK/2 between their immediately subsequent rising edges. The third and fourth phase clock signals CLK180, CLK270 have a time difference of about tCK/2 between their immediately subsequent rising edges.

The rising edges of the first to fourth phase clock signals CLK0, CLK90, CLK180, CLK270 correspond to the rising and falling edges of the external clock signal CLK. The external clock signal CLK has a period of tCK. A rising edge of the first phase clock signal CLK0 corresponds to a rising edge of the external clock signal for a period. Because there is a time difference of tCK/2 between immediately rising edges of the first and second phase clock signals CLK0, CLK90, a subsequent rising edge of the second phase clock signal CLK90 corresponds to the falling edge of the external clock signal CLK for the period. Because no duty cycle error is carried to the second phase clock signal CLK by the operation of the clock divider 120, the second phase clock signal CLK90 provides timing information of the falling edge of the external clock signal CLK without a duty cycle error even if the external clock signal CLK itself has one.

Because there is a time difference of tCK/2 between immediately adjacent rising edges of the second and third phase clock signals CLK90, CLK180, a subsequent rising edge of the third phase clock signal CLK180 corresponds to the rising edge of the external clock signal CLK for the immediately following period. In addition, because there is a time difference of tCK/2 between immediately adjacent rising edges of the third and fourth phase clock signals CLK180, CLK270, a subsequent rising edge of the fourth phase clock signal CLK270 corresponds to the falling edge of the external clock signal CLK for the immediately following period. In this manner, the first to fourth phase clock signals CLK0, CLK90, CLK180, CLK270 provide timing information of two rising and falling edges of the external clock signal CLK for two subsequent periods without a duty cycle error.

In the illustrated embodiment, the delay detection loop 420 forms a closed feedback loop along with the second MP delay line 410*b*. Thus, the delay detection loop 420 can determine whether or not the second MP delay line 410*b* is providing the first intermediate signal with a desired amount of delay. In addition, based on the determination, the delay detection loop 420 can adjust the delay amount of the MP delay line 410*b*. Thus, the multi-phase clock generator 400 can provide accurate timing for use in the internal circuits 30 (FIG. 2).

Figure 6:
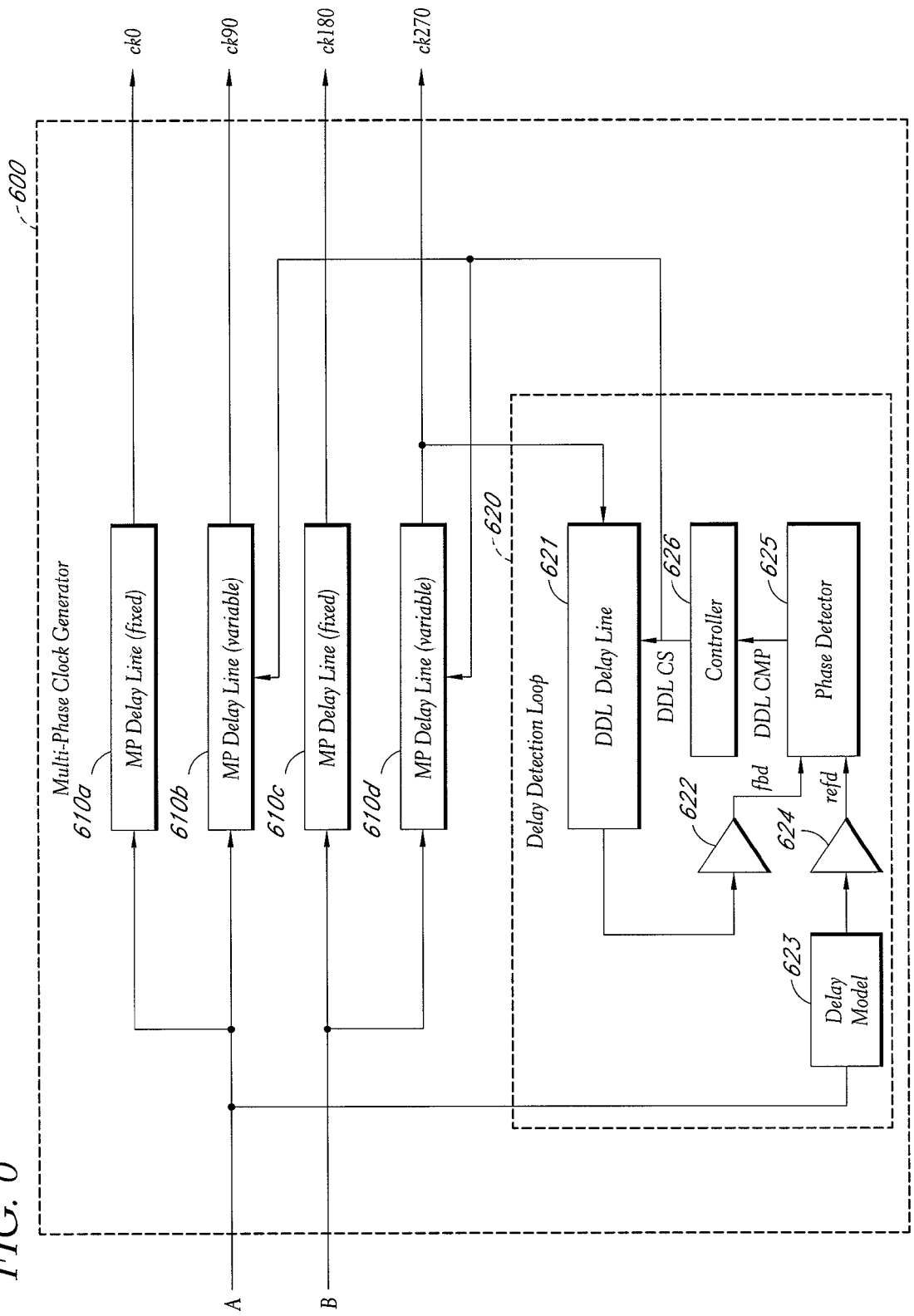
FIG. 6 is a schematic block diagram of another embodiment of the multi-phase clock generator of FIG. 3.

Referring to FIG. 6, another embodiment of the multi-phase clock generator of FIG. 3 will now be described in detail. The multi-phase clock generator 600 includes first to fourth multi-phase (MP) delay elements, such as delay lines 610*a*-610*d* and a delay detection loop (DDL) 620.

The first to fourth MP delay lines 610*a*-610*d* are configured to receive the first and second intermediate signals A, B (FIG. 3) and to generate first to fourth intermediate phase clock signals ck0, ck90, ck180, ck270. Each of the first and third MP delay lines 610a, 610c provides a fixed delay to a signal passing therethrough. Each of the second and fourth MP delay lines 610b, 610d provides a variable delay ranging from about 0° to about 180° to a signal passing therethrough.

In the illustrated embodiment, each of the second and fourth MP delay lines 610b, 610d includes a plurality of logic gates (for example, inverters) connected in series. A skilled artisan will appreciate that each of the second and fourth MP delay lines 610b, 610d also includes additional circuitry to provide a variable delay. A skilled artisan will also appreciate that various configurations of delay stages, delay cells, or delay circuits can be adapted for the second and fourth MP delay elements, such as delay lines 610a, 610d. Other details of the MP delay lines 610a-610d can be as described above with respect to the MP delay lines 410a-410d of FIG. 4.

The delay detection loop (DDL) 620 serves to detect a phase difference between the first intermediate signal A and the fourth intermediate phase clock signal ck270, and adjust the delay amounts of the second and fourth MP delay lines 610b, 610d. The DDL 620 may include a DDL delay line 621, a first DDL buffer 622, a DDL delay model 623, a second DDL buffer 624, a DDL phase detector 625, and a DDL controller 626. The fourth MP delay line 410d, the DDL delay line 621 and the first DDL buffer 622 form a first DDL path. The DDL delay model 623 and the second DDL buffer 624 form a second DDL path. In one embodiment, the details of the first and second DDL buffer 622, 624, the DDL phase detector 625, and the DDL controller 626 can be as described earlier with respect to the first and second DDL buffer 422, 424, the DDL phase detector 425, and the DDL controller 426, respectively, of FIG. 3.

The DDL delay line 621 receives the fourth intermediate phase clock signal ck270 from the fourth MP delay line 610d, and delays the fourth intermediate phase clock signal ck270, thereby providing an output signal to the first DDL buffer 622. In the illustrated embodiment, the DDL delay line 621 may include a series of logic gates (for example, inverters) and additional circuitry to provide a variable delay ranging from about 0° to about 180°. In another embodiment, the upper limit of the variable delay can be about 90° plus an intrinsic delay of the DDL delay line 621. In other embodiments, the upper limit of the variable delay can be any suitable amount between about 90° plus the intrinsic delay and about 180°.

The DDL delay model 623 receives the first intermediate signal A from the first delay line 130a (FIG. 3) and further delays the first intermediate signal A. The DDL delay model 623 emulates an intrinsic delay tID associated with the DDL delay line 621 and the minimum delay of the fourth MP delay line 610d. The DDL delay model 623 provides a delayed first intermediate signal to the second DDL buffer 624.

The DDL phase detector 625 compares a detection feedback signal fbd from the first DDL buffer 622 with a detection reference signal refd from the second DDL buffer 624. The DDL phase detector 625 generates a DDL comparison signal DDLCMP indicative of a phase difference between the detection feedback signal fbd and the detection reference signal refd. The DDL phase detector 625 provides the DDL comparison signal DDLCMP to the DDL controller 626.

The DDL controller 626 receives the DDL comparison signal DDLCMP, and provides the DDL delay line 621 with a DDL control signal DDLCS to adjust an amount of delay generated by the DDL delay line 621. The DDL controller 626 also provides the DDL control signal DDLCS to the second and fourth MP delay lines 610b, 610d. In this manner, the DDL controller 626 controls the second and fourth MP delay lines 610b, 610d to have substantially the same delay as the DDL delay line 621.

Figure 7:
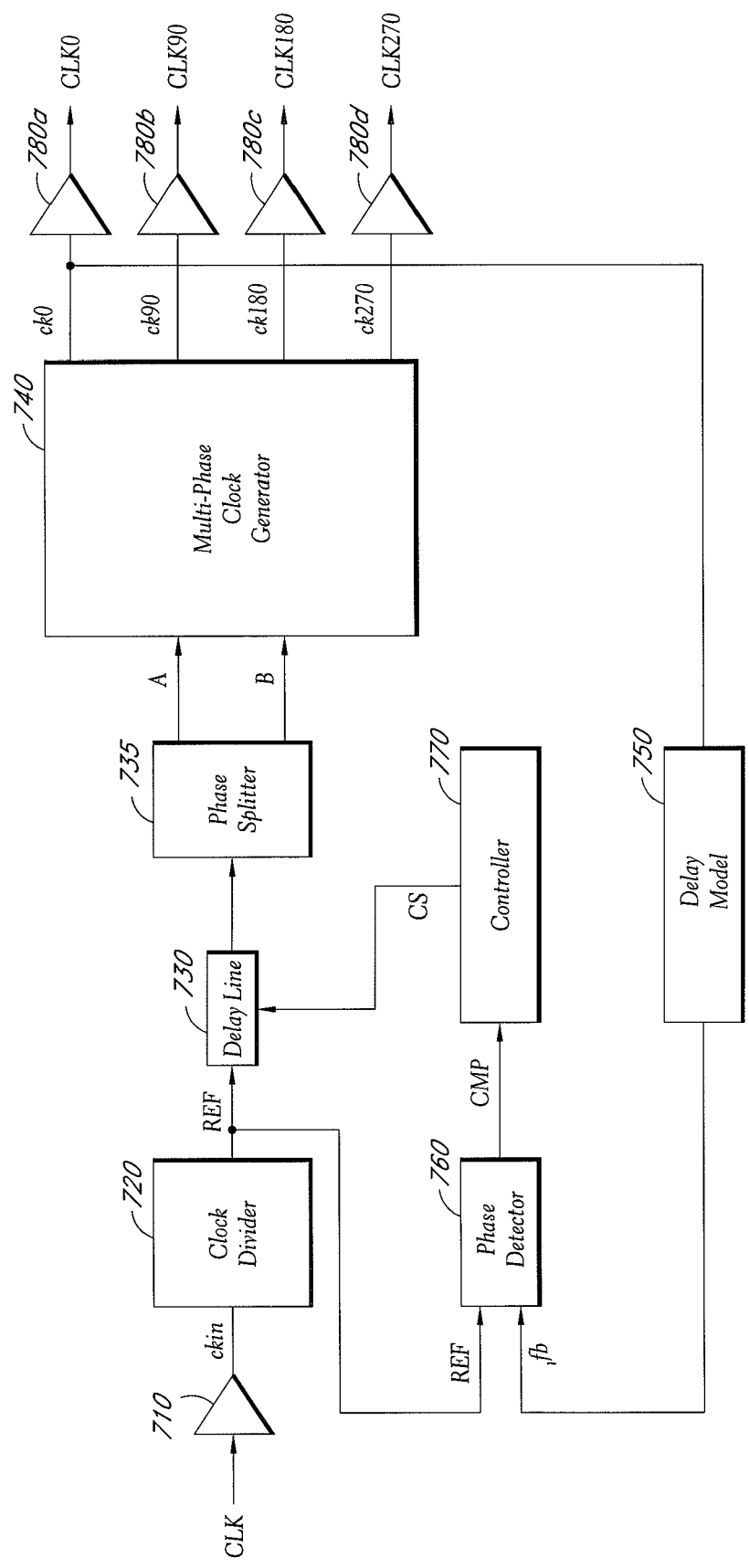
FIG. 7 is a schematic block diagram of another embodiment of the clock synchronization circuit of FIG. 2, including a multi-phase clock generator.

Referring to FIG. 7, another embodiment of the clock synchronization circuit of FIG. 2 will be now described. The illustrated circuit 700 includes an input buffer 710, a clock divider 720, a delay line 730, a phase splitter 735, a multi-phase clock generator 740, a delay model 750, a phase detector 760, a controller 770, and first to fourth clock buffers 780a-780d. The configurations of the input buffer 710, the multi-phase clock generator 740, the delay model 750, the phase detector 760, the controller 770, and the first to fourth clock buffers 780a-780d can be as described above with respect to the input buffer 110, the multi-phase clock generator 140, the delay model 150, the phase detector 160, the controller 170, and the first to fourth clock buffers 180a-180d, respectively, of FIG. 3.

The delay line 730, the phase splitter 735, the multi-phase clock generator 740, the delay model 750, and the phase detector 760, and the controller 770 together form a delay-locked loop (DLL) for synchronizing the output of the memory device 100 of FIG. 2 with the external clock signal CLK. The input buffer 710, the clock divider 720, the delay line 730, the phase splitter 735, the multi-phase clock generator 740, and the first clock buffer 780a form at least part of a forward clock path.

The input buffer 710 receives an external clock signal CLK. The input buffer 710 generates a clock-in signal ckin. The clock divider 720 receives the clock-in signal ckin, and generates a reference signal REF that has a frequency that is half of the frequency of the clock-in signal ckin. When generating the first reference signal REF1, the clock divider 720 changes the signal level only at the rising edges of the clock-in signal ckin. The clock divider 720, however, does not use a phase splitter in contrast to the clock divider 120 of FIG. 3. Other details of the clock divider 720 can be as described above with respect to the clock divider 120 of FIG. 3.

The delay line 730 receives the reference signal REF from the clock divider 720. The delay line 730 delays the reference signal REF, thereby outputting a delayed reference signal. Other details of the delay line 730 can be as described above with respect to the first delay line 130a of FIG. 3.

The phase splitter 735 receives the delayed reference signal from the delay line 730 and generates first and second intermediate signals A, B. The details of the first and second intermediate signals A, B can be as described above with respect to the first and second intermediate signals A, B of FIG. 3. The clock divider 720, the delay lines 730, and the phase splitter 735 together form an intermediate signal generation module.

The multi-phase clock generator 740 receives the first and second intermediate signals A, B. The multi-phase clock generator 740 generates first to fourth intermediate phase clock signals ck0, ck90, ck180, ck270. The detailed configuration of the clock generator 740 can be as described above with respect to either of the clock generators 400 and 600 of FIGS. 4 and 6.

Except for the operations of the clock divider 720, the delay line 730, and the phase splitter 735, it will be understood that the operation of the clock synchronization circuit 700 can be as described above with respect to that of the clock synchronization circuit 10 of FIG. 3.

As described above, the clock synchronization circuits of the embodiments can provide accurate falling edge information of an external clock signal. In addition, the clock synchronization circuits process a clock signal having a frequency that is a half of the frequency of the external clock signal. Thus, the circuits can reduce a possible clocking failure in high speed data transmission while also reducing power consumption.

The embodiments above are described for a case where the rising edges of an external clock signal are steady and the falling edges of the external clock signal are jittery. In other embodiments, the principles and advantages of the embodiments are applicable to the inverse case where the falling edges of an external clock signal are steady and the rising edges of the external clock signal are jittery.

In the illustrated embodiments, the clock synchronization circuits are described in the context of the electronic device of FIG. 2. In other embodiments, the clock synchronization circuits may be used in different configurations of electronic devices. A skilled artisan will appreciate that the clock synchronization circuits can be adapted for various other electronic devices for data synchronization or any other suitable purposes.

Examples of such electronic devices can include, but are not limited to, consumer electronic products, electronic circuits, electronic circuit components, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

One embodiment is an apparatus including a module configured to receive a clock signal having a first frequency and to generate a first intermediate signal and a second intermediate signal having edges delayed from first edges of the clock signal. Each of the first and second intermediate signals has a second frequency that is half of the first frequency. The first and second intermediate signals have a phase difference of about 180° from each other. The apparatus also includes a first delay element configured to delay the first intermediate signal by a first delay amount to generate a first phase clock signal; and a second delay element configured to delay the first intermediate signal by a second delay amount different than the first delay amount to generate a second phase clock signal. The first and second phase clock signals have a first phase difference of about 90° from each other. The apparatus further includes a third delay element configured to delay the second intermediate signal by a third delay amount to generate a third phase clock signal. The third delay amount is substantially the same as the first delay amount. The first and third phase clock signals have a second phase difference of about 180° from each other. The apparatus also includes a fourth delay element configured to delay the second intermediate signal by a fourth delay amount to generate a fourth phase clock signal. The fourth delay amount is substantially the same as the second delay amount. The first and fourth phase clock signals have a third phase difference of about 270° from each other. The apparatus further includes a delay detection loop configured to detect a fourth phase difference between the second phase clock signal and the second intermediate signal or between the fourth phase clock signal and the first intermediate signal, and to adjust the second and fourth delay amounts based at least partly on the fourth phase difference.

Another embodiment is a method of generating clock signals. The method includes generating a first intermediate signal and a second intermediate signal having edges delayed from first edges of a clock signal having a first frequency. The clock signal further includes second edges having jitter. Each of the first and second intermediate signals have a second frequency that is about half of the first frequency. The first and second intermediate signals have a phase difference of about 180° from each other. The method also includes delaying the first intermediate signal by a first delay amount to generate a first phase clock signal; and delaying the first intermediate signal by a second delay amount different than the first delay amount to generate a second phase clock signal such that the first and second phase clock signals have a first phase difference of about 90° from each other. The method further includes delaying the second intermediate signal by a third delay amount to generate a third phase clock signal. The third delay amount is substantially the same as the first delay amount such that the first and third phase clock signals have a second phase difference of about 180° from each other. The method also includes delaying the second intermediate signal by a fourth delay amount to generate a fourth phase clock signal. The fourth delay amount is substantially the same as the second delay amount such that the first and fourth phase clock signals have a third phase difference of about 270° from each other. The method also includes detecting a fourth phase difference between the second phase clock signal and the second intermediate signal or between the fourth phase clock signal and the first intermediate signal; and adjusting the second and fourth delay amounts based at least partly on the fourth phase difference.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
 a module configured to receive a clock signal having a first frequency and to generate a first intermediate signal and a second intermediate signal having edges delayed from first edges of the clock signal, each of the first and second intermediate signals having a second frequency that is half of the first frequency, the first and second intermediate signals having a phase difference of about 180° from each other;
 a first delay element configured to delay the first intermediate signal by a first delay amount to generate a first phase clock signal;
 a second delay element configured to delay the first intermediate signal by a second delay amount different than the first delay amount to generate a second phase clock signal, wherein the first and second phase clock signals have a first phase difference of about 90° from each other;
 a third delay element configured to delay the second intermediate signal by a third delay amount to generate a third phase clock signal, the third delay amount being substantially the same as the first delay amount, wherein the first and third phase clock signals have a second phase difference of about 180° from each other;

a fourth delay element configured to delay the second intermediate signal by a fourth delay amount to generate a fourth phase clock signal, the fourth delay amount being substantially the same as the second delay amount, wherein the first and fourth phase clock signals have a third phase difference of about 270° from each other; and a delay detection loop configured to detect a fourth phase difference between the second phase clock signal and the second intermediate signal or between the fourth phase clock signal and the first intermediate signal, and to adjust the second and fourth delay amounts based at least partly on the fourth phase difference.

2. The apparatus of claim 1, wherein the module is configured to generate the first and second intermediate signals only from the first edges of the clock signal.

3. The apparatus of claim 1, wherein the clock signal having the first frequency includes rising edges and falling edges, and wherein the first edges of the clock signal are the rising edges of the clock signal.

4. The apparatus of claim 1, wherein the first edges of the clock signal having the first frequency are stable in timing.

5. The apparatus of claim 1, wherein each of the first and third delay elements comprises a delay line having a fixed amount of delay, and wherein each of the second and fourth delay elements comprises a delay line having a variable amount of delay.

6. The apparatus of claim 5, wherein each of the second and fourth delay elements is configured to provide a delay having a minimum amount, and wherein each of the first and third delay elements is configured to provide a delay having an amount substantially equal to the minimum amount.

7. The apparatus of claim 6, wherein the module comprises:
a clock divider configured to receive the clock signal and to generate a first reference signal and a second reference signal from the first edges of the clock signal;
a fifth delay element configured to delay the first reference signal by a fifth delay amount to generate the first intermediate signal; and
a sixth delay element configured to delay the second reference signal by a sixth delay amount that is substantially the same as the fifth delay amount to generate the second intermediate signal.

8. The apparatus of claim 7, further comprising a delay-locked loop (DLL) configured to adjust the fifth and sixth delay amounts.

9. The apparatus of claim 8, wherein the DLL comprises:
a first delay model configured to delay an output signal from the first delay element;
a first phase detector configured to detect a phase difference between the first reference signal and the delayed output signal from the first delay model; and
a first controller configured to adjust the fifth and sixth delay amounts at least partly in response to the detected phase difference.

10. The apparatus of claim 9, further comprising:
an input buffer configured to receive and delay the clock signal, and to provide the clock divider with the clock signal; and
an output buffer configured to delay the first phase clock signal,
wherein the first delay model replicates a delay associated with at least one of the input buffer, the output buffer, and the clock divider.

11. The apparatus of claim 8, wherein the delay detection loop comprises:

a seventh delay element configured to delay the second phase clock signal by a variable delay amount, the seventh delay element having a minimum delay;
a second delay model configured to delay the second intermediate signal by a fixed delay amount substantially equal to the minimum delay of the seventh delay element;
a second phase detector configured to detect a phase difference between the delayed second phase clock signal and the delayed second intermediate signal; and
a second controller configured to adjust the delay amount of the seventh delay element at least partly in response to the detected phase difference between the delayed second phase clock signal and the delayed second intermediate signal.

12. The apparatus of claim 11, wherein the second controller is further configured to adjust the second and fourth delay amounts at least partly in response to the detected phase difference between the delayed second phase clock signal and the delayed second intermediate signal.

13. The apparatus of claim 8, wherein the delay detection loop comprises:
a seventh delay element configured to delay the fourth phase clock signal by a variable delay amount, the seventh delay element having a minimum delay;
a second delay model configured to delay the first intermediate signal by a fixed delay amount substantially equal to the minimum delay of the seventh delay element;
a second phase detector configured to detect a phase difference between the delayed fourth phase clock signal and the delayed first intermediate signal; and
a second controller configured to adjust the delay amount of the seventh delay element at least partly in response to the detected phase difference between the delayed fourth phase clock signal and the delayed first intermediate signal.

14. The apparatus of claim 13, wherein the second controller is further configured to adjust the second and fourth delay amounts at least partly in response to the detected phase difference between the delayed fourth phase clock signal and the delayed first intermediate signal.

15. The apparatus of claim 1, wherein the apparatus comprises a solid state memory device, and wherein the solid state memory device is configured to transmit at least part of data on falling edges of the clock signal.

16. The apparatus of claim 1, wherein the module comprises:
a clock divider configured receive the clock signal and to generate a reference signal from the first edges of the clock signal;
a fifth delay element configured to delay the reference signal; and
a phase splitter configured to receive the delayed reference signal from the fifth delay element, and to generate the first and second intermediate signals from the delayed reference signal.

17. A method of generating clock signals, the method comprising:
generating a first intermediate signal and a second intermediate signal having edges delayed from first edges of a clock signal having a first frequency, the clock signal further including second edges having jitter, each of the first and second intermediate signals having a second frequency that is about half of the first frequency, the first and second intermediate signals having a phase difference of about 180° from each other;

delaying the first intermediate signal by a first delay amount to generate a first phase clock signal;

delaying the first intermediate signal by a second delay amount different than the first delay amount to generate a second phase clock signal such that the first and second phase clock signals have a first phase difference of about 90° from each other;

delaying the second intermediate signal by a third delay amount to generate a third phase clock signal, the third delay amount being substantially the same as the first delay amount such that the first and third phase clock signals have a second phase difference of about 180° from each other;

delaying the second intermediate signal by a fourth delay amount to generate a fourth phase clock signal, the fourth delay amount being substantially the same as the second delay amount such that the first and fourth phase clock signals have a third phase difference of about 270° from each other;

detecting a fourth phase difference between the second phase clock signal and the second intermediate signal or between the fourth phase clock signal and the first intermediate signal; and adjusting the second and fourth delay amounts based at least partly on the fourth phase difference.

18. The apparatus of claim 17, wherein generating the first and second intermediate signals comprises generating the first and second intermediate signals only from the first edges of the clock signal.

19. The method of claim 17, further comprising varying the second and fourth delay amounts.

20. The method of claim 19, wherein each of the second and fourth delay amounts has a minimum amount, and wherein each of the first and third delay amounts has a fixed amount that is substantially equal to the minimum amount.

21. The method of claim 20, further comprising:
generating a first reference signal and a second reference signal from the first edges of the clock;
delaying the first reference signal by a fifth delay amount to generate the first intermediate signal; and
delaying the second reference signal by a sixth delay amount that is substantially the same as the fifth delay amount to generate the second intermediate signal.

22. The method of claim 21, further comprising:
further delaying the first phase clock signal;
detecting a phase difference between the delayed first phase clock signal and the first reference signal;
adjusting the fifth and sixth delay amounts at least partly in response to the phase difference between the delayed first phase clock signal and the first reference signal.

23. The method of claim 22, wherein detecting the fourth phase difference comprises:
further delaying the second phase clock signal by a variable delay amount, thereby generating a first output signal;
further delaying the second intermediate signal by a fixed delay amount, thereby generating a second output signal;
detecting a phase difference between the first and second output signals; and
adjusting the variable delay amount at least partly in response to the detected phase difference between the first and second output signals.

24. The method of claim 22, wherein detecting the fourth phase difference comprises:
further delaying the fourth phase clock signal by a variable delay amount, thereby generating a first output signal;
further delaying the first intermediate signal by a fixed delay amount, thereby generating a second output signal;
detecting a phase difference between the first and second output signals; and
adjusting the variable delay amount at least partly in response to the detected phase difference between the first and second output signals.

25. The method of claim 17, further comprising transmitting data at least partly in synchronization with at least one of the rising edges of the first to fourth phase clock signals or signals further delayed from the first to fourth phase clock signals.

26. The method of claim 17, further comprising,
generating a reference signal from the first edges of the clock;
delaying the reference signal by a fifth delay amount; and
generating the first and second intermediate signals from the delayed reference signal.

* * * * *

UNITED STATES PATENT AND TRADEMARK OFFICE
CERTIFICATE OF CORRECTION

PATENT NO. : 7,642,827 B2
APPLICATION NO. : 12/128189
DATED : January 5, 2010
INVENTOR(S) : Jongtae Kwak Page 1 of 1

It is certified that error appears in the above-identified patent and that said Letters Patent is hereby corrected as shown below:

In column 16, line 49, in Claim 16, after "configured" insert -- to --.

In column 18, line 37, in Claim 26, delete "comprising," and insert -- comprising: --, therefor.

Signed and Sealed this

Eleventh Day of May, 2010

David J. Kappos
*Director of the United States Patent and Trademark Office*